United States Patent [19]

Horne et al.

[11] 4,141,081

[45] Feb. 20, 1979

[54] MNOS BORAM SENSE AMPLIFIER/LATCH

[75] Inventors: Merton A. Horne, Eagan; Walter W. Heikkila, Burnsville, both of Minn.

[73] Assignee: Sperry Rand Corporation, New York, N.Y.

[21] Appl. No.: 866,690

[22] Filed: Jan. 3, 1978

[51] Int. Cl.$^2$ ............................................. G11C 11/40
[52] U.S. Cl. ...................................... 365/203; 365/45;
   365/154; 365/210; 307/238
[58] Field of Search ................... 365/189, 203, 45, 46,
   365/154, 210; 307/238

[56] References Cited

U.S. PATENT DOCUMENTS 3,900,838   8/1975   Weidmann ........................ 365/203

Primary Examiner—Terrell W. Fears
Attorney, Agent, or Firm—Douglas L. Tschida; Kenneth T. Grace; Marshall M. Truex

[57] ABSTRACT

A sense amplifier/latch circuit for a Metal Nitride Oxide (MNOS) Block Orgaized Random Access Memory (BORAM) with analog memory retention interrogation capabilities. The sense amplifier/latch circuit includes the associative memory transistors as an integral part of the latch as well as circuitry for increasing the switching speed of the sense latch in response to the differing conductances of the memory transistors when a row address voltage is applied to their gates.

7 Claims, 9 Drawing Figures

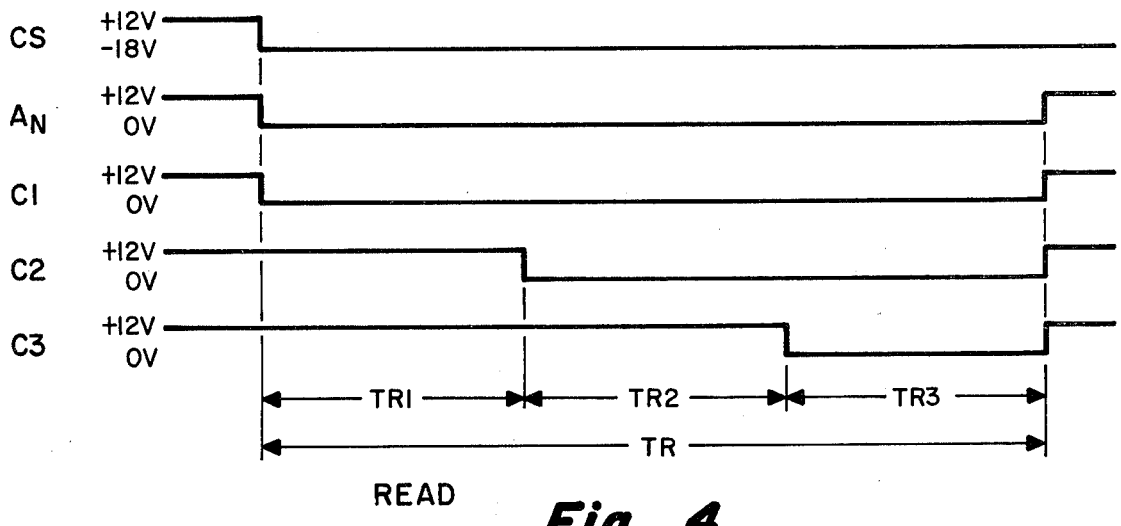
Fig. 4 READ
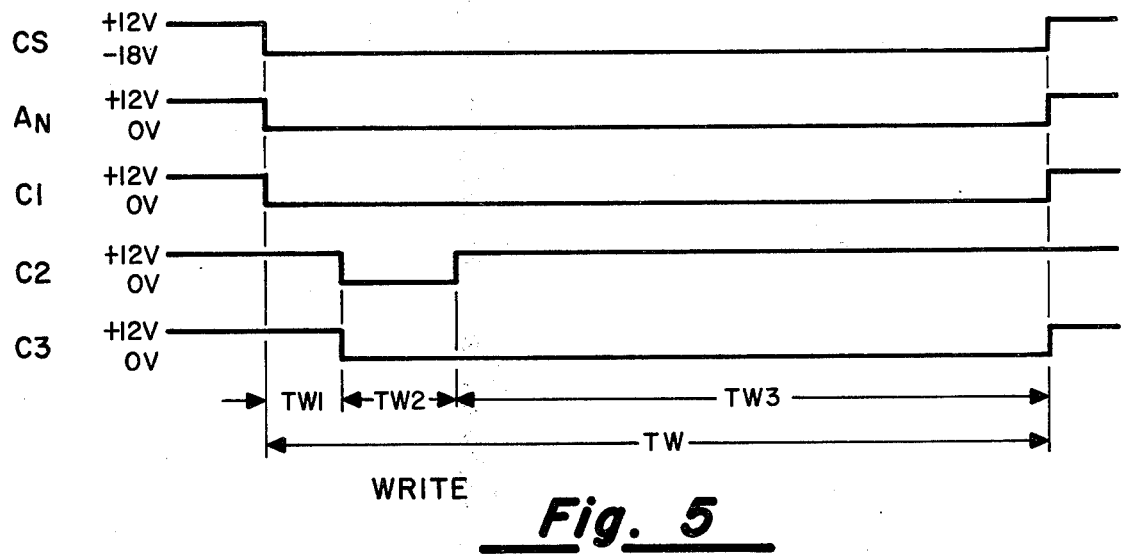
Fig. 5 WRITE
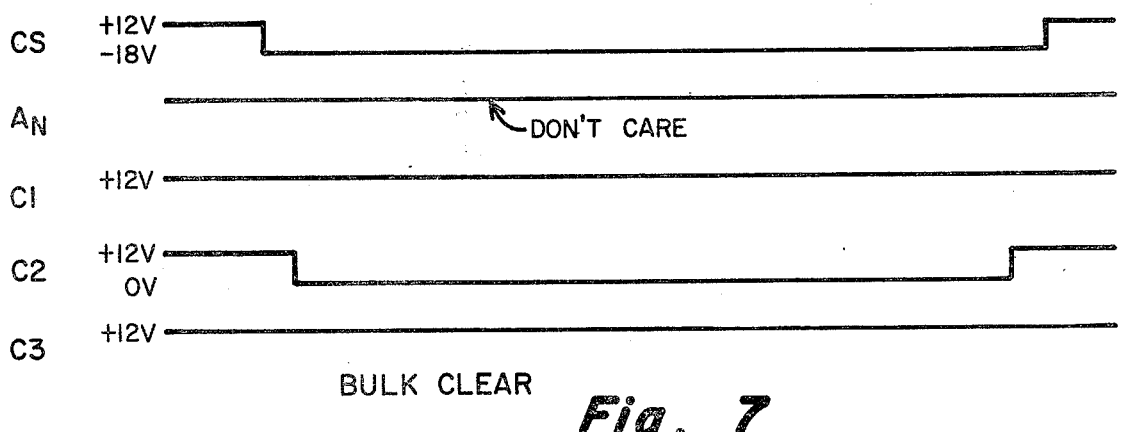
Fig. 7 BULK CLEAR

BLOCK CLEAR 4,141,081

MNOS BORAM SENSE AMPLIFIER/LATCH

SUMMARY OF THE INVENTION

An improved sense amplifier/latch circuit is disclosed of the type used for reading and writing binary data out of or into an associative MNOS field effect transistor (FET) memory array or for measuring the array's analog threshold voltage memory window. The sense latch is constructed in a BORAM organization and includes the associative memory transistors as an integral part of the sense latch as well as additional circuitry and control for increasing the latch switching speed.

The gates of the memory transistors are directly addressed by an appropriate row address voltage during the respective clear, read, write and analog threshold measurement modes of operation to enable the sense amplifier/latch to sense the threshold voltages and the corresponding differing conductances of the two memory transistors in each memory cell. The characteristic analog threshold voltage of each memory transistor is determined by independently isolating each of the memory transistors and incrementally varying the row address voltages while monitoring the state of the sense latch.

The improved switching speed of the sense latch is obtained in spite of the parasitic capacitance and resistance of the common source and drain lines of the memory array by circuitry which couples an appropriate voltage source to the nodes of the sense latch to amplify the differential switching rates at the nodes and cause the sense latch to latch faster.

BACKGROUND OF THE INVENTION

In the field of nonvolatile semiconductor memories of the metal nitride oxide semiconductor field effect transistor (MNOS FET) type, binary information is stored in the memory transistors of an array by appropriately switching the threshold voltages of the memory transistors between their upper and lower stable states. To enable the sensing of the memory transistors' present state, or the analog voltage characteristic of each memory transistor's stable states, a sense latch is coupled to the memory array. Such a sense latch was previously described in the earlier filed patent applications of Merton A. Horne and Thomas A. Pogemiller, Ser. No. 821,272, filed Aug. 3, 1977; and Bruce A. Brillhart and Merton A. Horne, Ser. No. 821,271, filed Aug. 3, 1977. The sense latch of the earlier applications described a sense latch circuit and the method for operating the sense latch in its various modes of operation in a random access memory (RAM), where the threshold voltages, corresponding to the binary information stored in the associative MNOS memory cells, were indirectly sensed and used to switch the gates of transistors selectively coupled in parallel to the sense latch.

Due to the organizational differences between the previous RAM organization and the BORAM organization described herein, it becomes prohibitive from the standpoint of the amount of space available on an integrated circuit chip to implement the earlier defined circuitry in an unmultiplexed BORAM. The present invention therefore teaches a sense amplifier/latch circuit which provides for the direct sensing of the memory transistors' threshold voltages by incorporating the memory transistors in the sense latch and impressing an appropriate row address voltage on the gates of the memory transistors for sensing the corresponding stored binary information and the analog threshold voltage memory window for each column of associative memory cells of the BORAM. While an equal number of sense amplifier/latch circuits as the number of columns in the memory array are required in the present BORAM organization, the different sensing technique and improved sense latch circuitry minimize the amount of chip space required and improve the switching speed of the sense latch, thereby making it possible to test the characteristic threshold voltages of the memory transistors but for a memory array of eight times the size as previously described.

In a paper, entitled Hardened MNOS/SOS Electrically Reprogammable Non-Volatile Memory, authored by J. R. Cricchi, et al, of Westinghouse Electric Corp. and B. T. Ahlport of Northrop Corp., delivered to the IEEE Annual Conference on Nuclear and Space Radiation Effects on July 12 to 15, 1977, a sense latch circuit and technique is disclosed for use in conjunction with an electrically reprogrammable MNOS RAM memory which is fabricated on a sapphire substrate. The RAM is organized in a 64 × 16 array, which is multiplexed to produce a 256-word × 4-bit MNOS/SOS memory. The sense latch used in conjunction with this organization, while similar in basic appearance to the present invention, inherently contains significant differences which preclude its use in BORAM organizations similar to that taught by the present invention. Its application in an unmultiplexed BORAM organization, similar to that described herein, would require additional chip space to accommodate the test point transistors as well as an additional 64 pins per chip to enable the measurement of the chip's analog memory window. The significance of these differences are more fully described hereinafter.

The sense amplifier/latch of the present invention therefore teaches an improved sense latch operable in selective read, write and analog threshold test modes of operation, which can be efficiently incorporated in a BORAM organization without a burdensome increase in the total number of external pins or in the chip size.

BRIEF DESCRIPTION OF THE DRAWINGS

FIG. 4 is the read timing diagram for the sense amplifier/latch of FIG. 2.

FIG. 5 is the write timing diagram for the sense amplifier/latch of FIG. 2.

FIG. 7 is a bulk clear timing diagram.

DESCRIPTION OF THE PREFERRED EMBODIMENT

The sense amplifier/latch of the present invention will now be described with particular reference to the drawings, wherein the sense latch circuitry, control signals and timing sequence, application in an MNOS BORAM memory organization and prior art are disclosed. A sense latch operable in a read mode or in an analog test mode was previously described in the patent applications of Merton A. Horne and Thomas A. Pogemiller Ser. No. 821,272 and Bruce A. Brillhart and Merton A. Horne, Ser. No. 821,271. The sense latch described in the earlier filed patent applications, however, was used in a 1K Random Access Memory (RAM) with a 256 word × 4-bit organization with full decoding to provide a 4-bit multiplexed output. The earlier organization used a minimum read disturb technique for sensing the binary data and corresponding threshold voltages of the associative MNOS memory cells, the resultant differential voltages were then used to switch the gates of transistors coupled in parallel to the sense latch. The operation of the sense latch further required additional override select circuitry to selectively couple the differential outputs of the memory transistors to the sense latch so that the latch could be operated in its read or analog memory test mode, which permitted the testing of the individual characteristic analog threshold voltages of the memory transistors within each of the memory cells.

Figure 1:
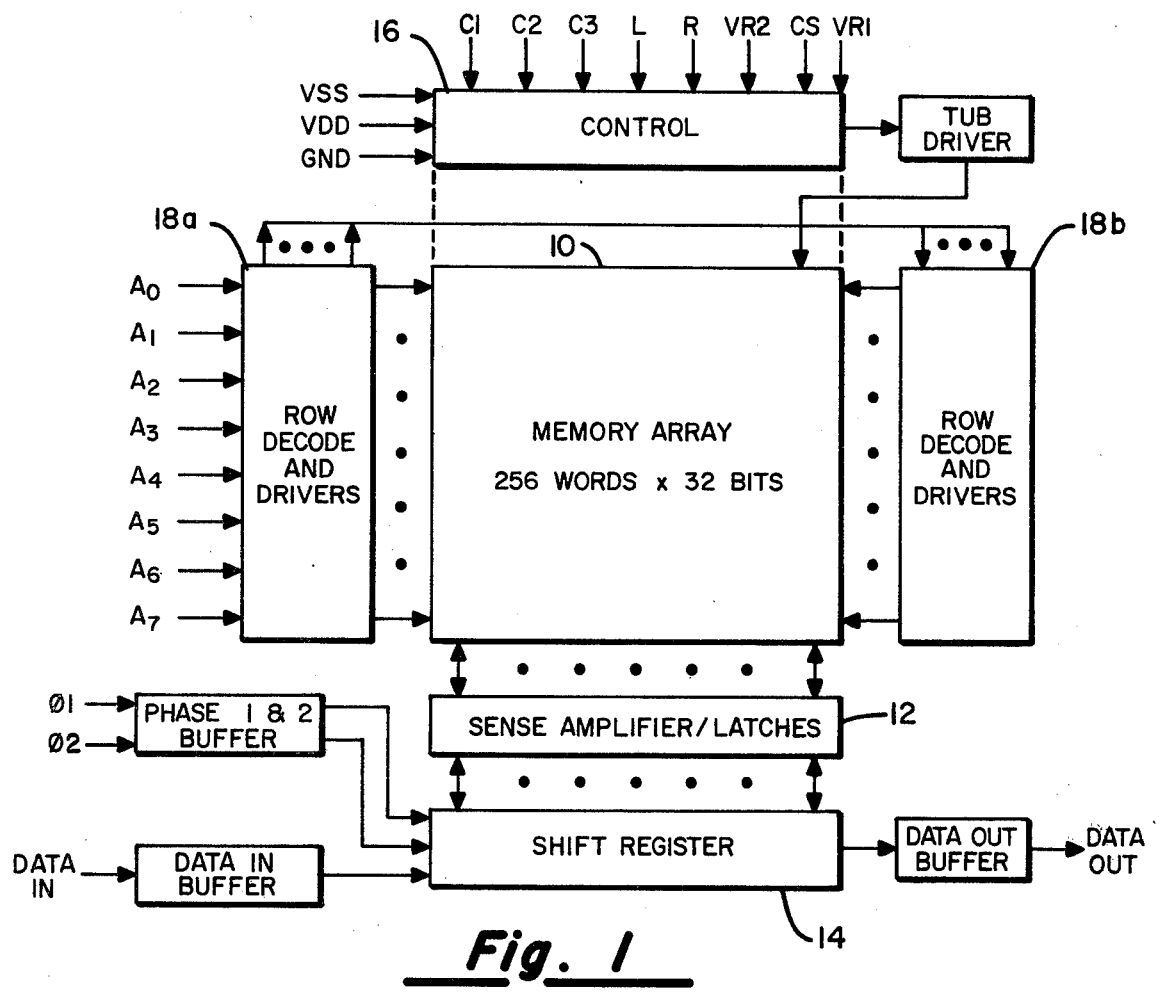
FIG. 1 is a block diagram of the BORAM memory organization.

The sense amplifier/latch of the present invention, however, is used in a Block Oriented Random Access Memory (BORAM) organization, see FIG. 1, wherein the associative MNOS FET memory cells of the memory array 10 are organized in a 256-word × 32-bit configuration. The BORAM is constructed using P channel (MNOS) devices, where each memory cell consists of two stepped-gate MNOS FET memory transistors. The cells are arranged in 32 columns in which the memory transistors are constructed along common diffused source and drain lines. The differential sensing of the selectively addressed associative memory cells occurs at the sense amplifier/latch 12 at the end of each of the 32 columns of the memory array 10. Binary information is therefore written into or read out of the memory array and the memory cells are tested a block at a time by the appropriate application of the two clocks $\phi 1$ and $\phi 2$ and control inputs CS, C1, C2, C3, L, R, VR1 and VR2 via the control circuitry 16 and the 32-bit serial shift register 14 coupled to the column sense amplifier/latches 12.

Because the data in such an organization is read and written in blocks of 32 bits, the use of the earlier described sense latch circuitry and minimum disturb technique would be prohibitive in that 32 of such sense latches would be required to interface between the memory columns and the shift register 14. The required 32 sense latches would require an unreasonable amount of space on an individual integrated circuit chip, if incorporated in the BORAM organization just described, and therefore the sense amplifier/latch 12 of the present invention is advantageous in that it requires less circuitry and chip space, while still enabling the individual testing of the characteristic threshold voltages of each memory transistor of each of the associative memory cells of the array.

Figure 2:
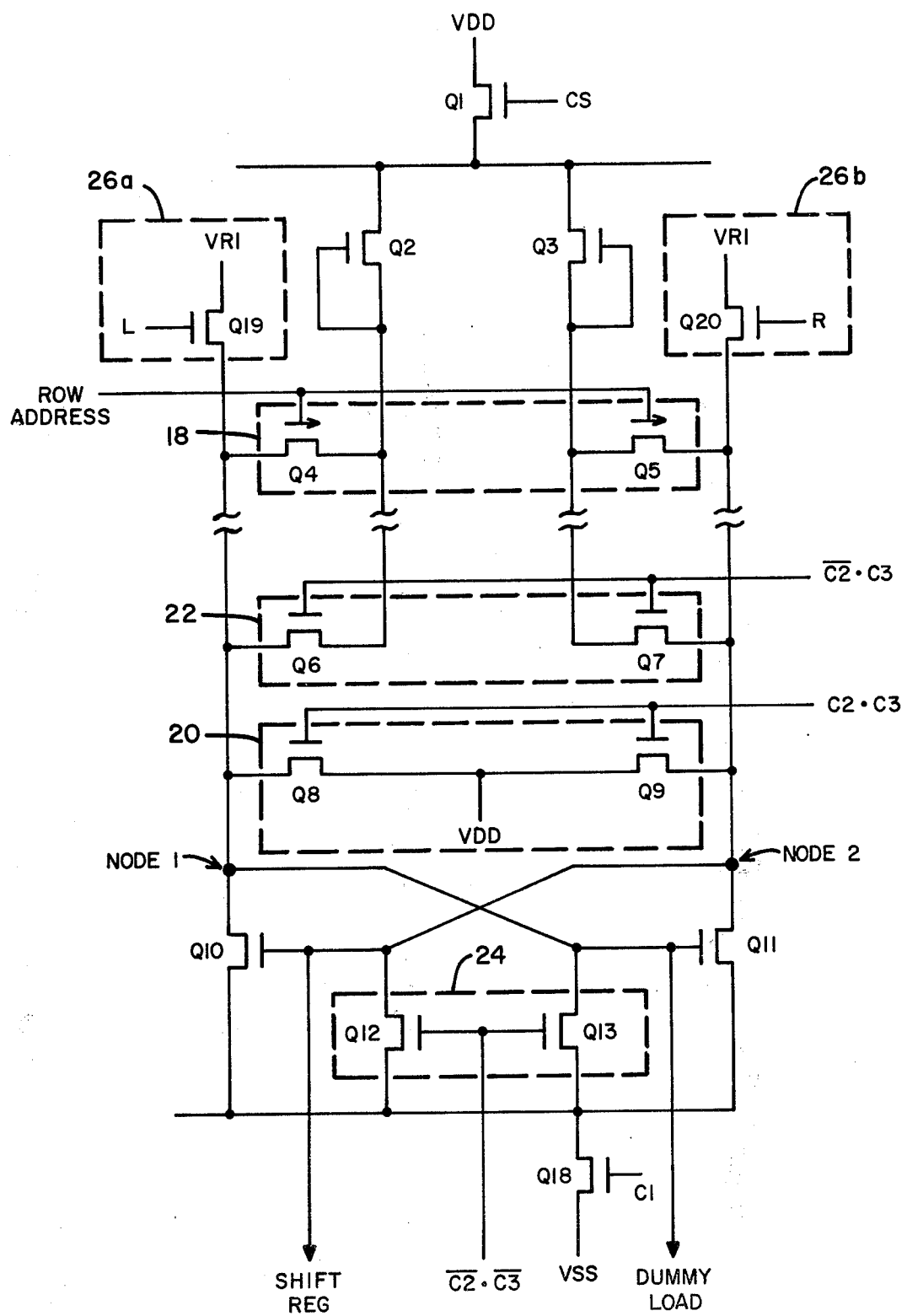
FIG. 2 is a schematic of an individual column of the memory array and its associated sense amplifier/latch.

One of the 32 sense amplifier/latches 12 of the present invention used in conjunction with the BORAM organization of FIG. 1 is shown in FIG. 2 and its operation will be described with particularly during its read, write and analog test modes. The description will further be directed to a representative memory cell 18 comprised of memory transistors Q4 and Q5, wherein binary information is stored in the form of differential threshold voltages which are written into the individual transistors, but with the understanding that there are 256 of such cells within each column of the memory array 10.

The typical width-to-length ratios of the transistors from which each of the sense amplifier/latches 12 is constructed are set forth in the following table:

| WIDTH/LENGTH RATIOS | |
|---|---|
| TRANSISTOR (Q) | W/L |
| 6, 7, 10, 11, 19, 20 | 3.4/1 |
| 2, 3, 12, 13 | 2/1 |
| 4, 5 | 1/1.3 |
| 8, 9 | 1/1.6 |
| 1, 18 | 6.8/1 |

Figure 6:
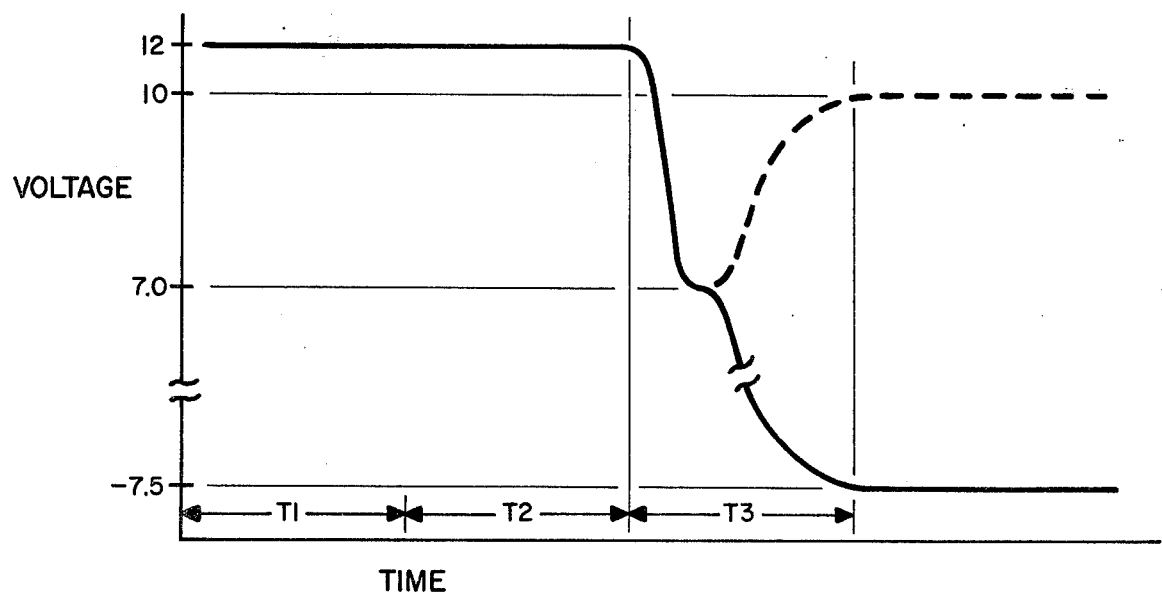
FIG. 6 is a graph of the typical outputs from nodes 1 and 2 of the sense amplifier/latch of FIG. 2.

In conjunction with the operation of the sense amplifier/latch 12 during its various modes of operation, reference is called to FIGS. 4, 5, 7 and 8 where the read, write, bulk clear and block clear timing diagrams are disclosed as well as FIG. 6 where the sense amplifier/latch's 12 nodes 1 and 2 outputs are shown. The specific control signals and timing are established by the control circuitry 16.

Figure 3:
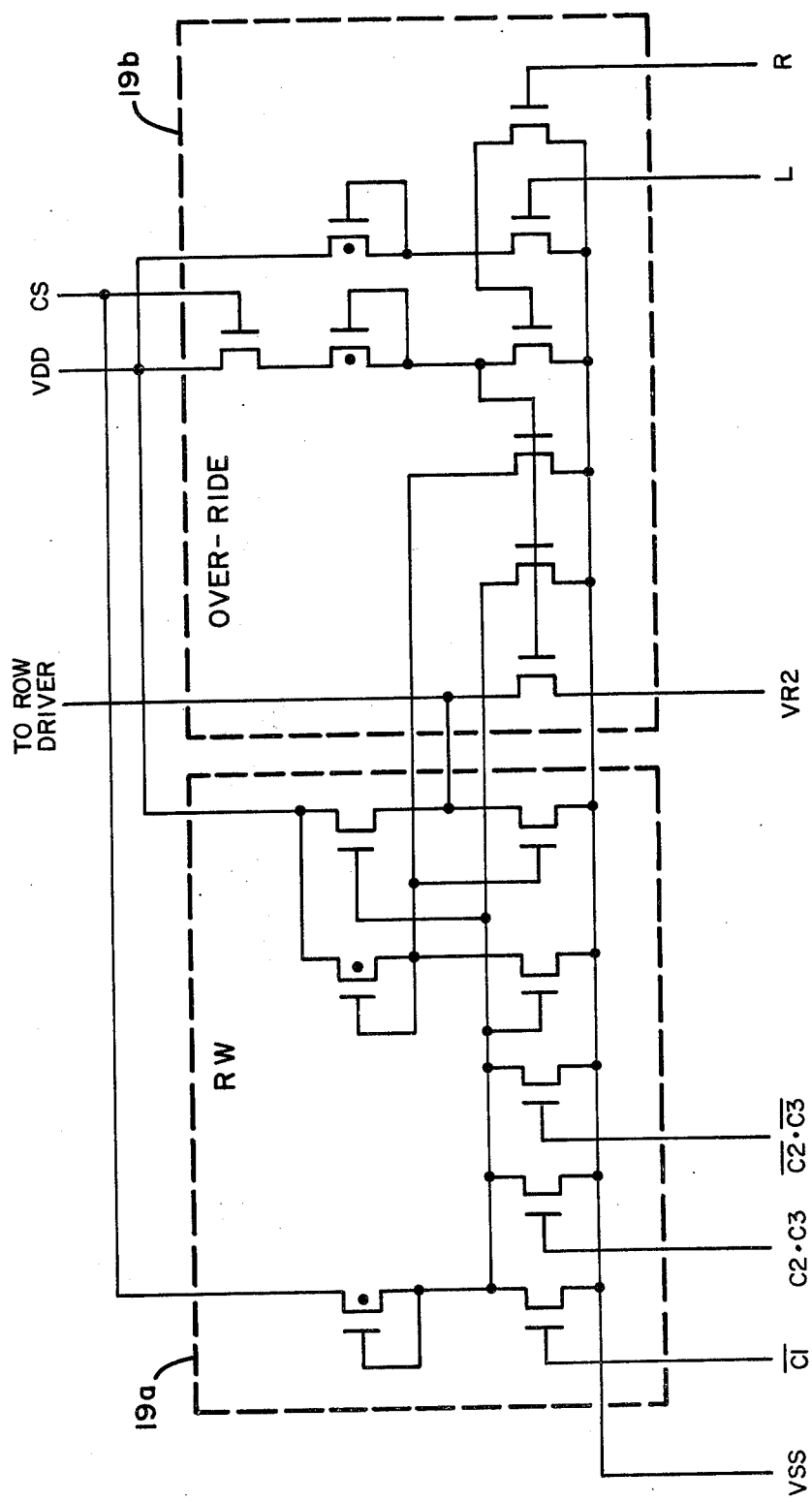
FIG. 3 is a schematic of the circuit which produces the appropriate row address voltage that is impressed on the gates of the memory transistors during the various modes of operation of the sense latch.

During the read, write and analog test modes of the sense latch 12 an individual memory cell of each column is addressed. The specific block of cells to be selected and operated on at any given time is defined by address signals A0 through A7, and the selection is achieved via the lower and upper row decode and driver circuitry 18a and 18b. Depending on the block to be addressed A0 through A6 defines 1 of 128 possible rows and A7 specifies whether the block is in the lower, rows 0 thru 127, or upper, rows 128 through 256, half of the memory 10. On the selection of a specific row of the memory array 10 an appropriate row address voltage determined by the circuitry of FIG. 3 is applied to the gates of the selected memory transistors, which voltage while applied as a constant will exponentially decrease due to loading from a +12 volts to −12 volts. During the write or clear operations the row address voltage is allowed to decay to the −12 volts, but during a read or memory test operation the decay is cut short to a voltage intermediate to the two characteristic threshold voltages. The specific timing of the applied row address voltage is determined via the circuitry of FIG. 3, where the read-write, RW, circuitry 19a is active during the read and write modes and the override circuitry 19a is active during the analog test mode. During the analog test mode a row address voltage, VR2, which differs from the row address voltage of the read and write modes in that it is incrementally varied over successive read cycles, is applied to the gates of the memory transistors.

During a read operation each sense amplifier/latch 12 associated with a column of memory cells will operate to sense the differential threshold states of its addressed memory transistors to cause the latch to switch in response to the differential states and transfer the single bit of binary data represented thereby from the latch output node 1 to the serial shift register 14, where the binary information sensed by each latch 12 will be accumulated and subsequently serially shifted out in a block of 32 bits. During a write operation each sense latch 12 will operate to selectively write binary information into its associated, previously cleared memory cell from the shift register 14.

Figure 8:
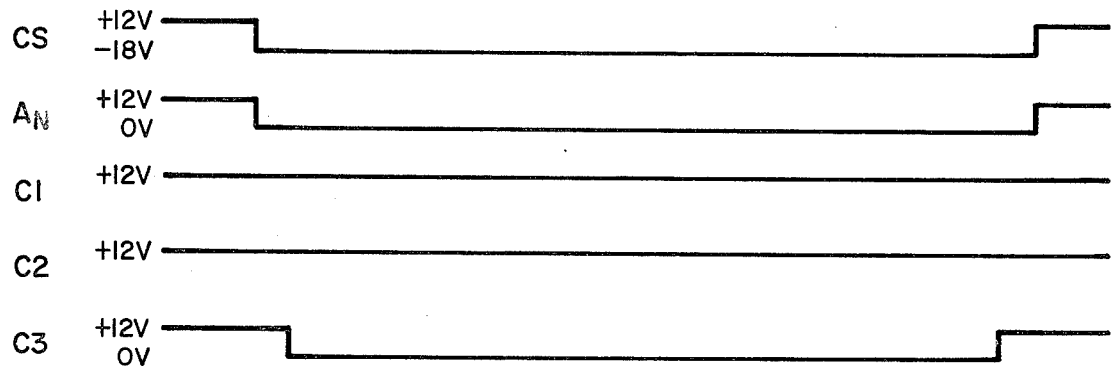
FIG. 8 is a block clear timing diagram.

The clearing of the memory transistors can be performed on the array in either a bulk clear of a block clear operation by applying the signals of FIGS. 7 and 8. The individual sense amplifier/latches 12 do not operate in the clear modes since they are isolated from the source voltage, $V_{SS}$, via transistor Q18 in FIG. 2. In the clear modes of operation C1 is at a +12 volts which turns Q18 off and effectively isolates the sense amplifier/latches 12 from the memory array 10.

Referring to FIGS. 2 and 5 the sense amplifier/latch 12 can be operated to selectively write binary information into previously cleared memory cells, wherein the threshold voltages of each of the memory transistors within the cells of an addressed row have been cleared to typically −2 volts.

The write operation of a sense amplifier/latch 12 over a total write period TW, typically 100 μsec, will be described with reference to memory cell 18 and the incremental periods TW1, typically 1 μsec, TW2, typically 2 μsec, and TW3, typically 97 μsec of FIG. 5 and corresponding latch 12 switching periods T1, T2 and T3 of FIG. 6. During a write operation the application of C1 and CS to the gates of Q18 and Q1 causes $V_{DD}$, typically −18 volts, to be impressed on the common drain connected depletion mode transistors Q2 and Q3 and $V_{SS}$, typically +12 volts, to be impressed on the common source connected transistors Q10, Q11 and Q12 and Q13 of precharge means 24 so that during the precharge period, TW1, nodes 1 and 2 of the sense latch 12 charge to +12 volts via the application of the logic combination $\overline{C2} \cdot \overline{C3}$ to the gates of Q12 and Q13 which causes these transistors to turn on. Depending on the data which has been serially shifted into the shift register, the sense amplifier/latch 12 during the transfer time, TW2, will cause nodes 1 and 2 to switch and assume stable, differential voltages, typically −7.5 and +10 volts. The switching of the latch during this time is amplified by the application of C2 · C3 to the gates of Q8 and Q9 of amplifying means 20 which causes these transistors to turn on, thereby impressing $V_{DD}$ directly on the more negative node which causes the latch to switch faster. The data represented by the differential voltages on nodes 1 and 2 is then written into the memory cell 18 during TW3. During TW3 $\overline{C2} \cdot C3$ is applied to the gates of transistors Q6 and Q7 of write means 22, which causes these transistors to turn on and short the source and drain of each memory transistor Q4 and Q5 together, insuring that channel shielding does occur, and that only one transistor of the cell is written. The row address voltage during TW3 will have decayed to approximately −12 volts and depending upon which node was previously charged to +10 volts during TW2, the associated memory transistor threshold voltage will be written to approximately −10 volts while the other memory transistor will be inhibited and remain at a −2 volts. The differential threshold voltages of the memory transistors of each of the addressed memory cells are written in a similar manner so that an entire block of data is thereby written into the memory array from the shift register.

The read operation of the sense amplifier/latch 12 will now be described with reference to the incremental periods TR1, TR2, and TR3 of the total read time, TR, see FIG. 4 and corresponding latch 12 switching periods T1, T2 and T3 of FIG. 6. During a read operation of the sense amplifier/latch 12, the application of C1 and CS to the gates of transistors Q18 and Q1 turn these transistors on thereby impressing $V_{DD}$ on the common drain connection of the depletion mode transistors Q2 and Q3 and $V_{SS}$ on the common source connected transistors Q10, Q11 and Q12 and Q13 of precharge means 24. During the precharge period TR1, typically 1.5 μsec, a voltage corresponding to the logic combination $\overline{C_2} \cdot \overline{C_3}$ is applied to the common connected gates of Q12 and Q13, causing these transistors to turn on and nodes 1 and 2 of the sense latch to charge to $V_{SS}$. Upon the timing out of TR1 and during the read period TR2, the logic combination of $\overline{C_2} \cdot \overline{C_3}$ becomes inactive, which turns off transistors Q12 and Q13, and permits nodes 1 and 2 to discharge through the respective memory transistors Q4 and Q5 of memory cell 18 towards the −18 volts impressed on the common drain connected depletion mode transistors Q2 and Q3. Depending upon their previously written threshold states, one transistor typically set at a −2 and the other set at a −10 volts, the respective gate source voltage drops of memory transistors Q4 and Q5 during TR2 will cause nodes 1 and 2 to discharge towards values that will differ and be dependent upon the specific threshold states. As nodes 1 and 2 discharge in this differential manner, the voltages are impressed on the gates of the sense latch 12 transistors Q10 and Q11, which causes the latch 12 to switch and assume stable states that will be indicative of the threshold voltages previously written into the memory transistors Q4 and Q5. Specifically, the latch output nodes 1 and 2 will assume values of approximately a +10 volts and a −7.5 volts, see FIG. 6, which differential outputs correspond to the stored binary information.

During the read time TR2, typically 1.5 μsec, the row address voltage will have decayed to a value intermediate the threshold voltages of the memory transistors causing the memory transistors to conduct; the conductance however being dependent on each memory transistor's previously written threshold voltage. During transfer time TR3, typically 1.5 μ sec, the logic combination of $C_2 \cdot C_3$ is applied to the gates of transistors Q8 and Q9 turning these transistors on and causing $V_{DD}$, typically a −18 volts, to be impressed on nodes 1 and 2. Because the latching speed of the sense latch is dependent upon the length of the common source and drain line diffusions of the memory transistors, the parasitic capacitance and resis-tance of the diffused lines will affect the switching speed of the sense latch. The turning on of transistors Q8 and Q9 of amplifying means 20 amplifies the switching speed of the sense latch by amplifying the voltage differential between nodes 1 and 2 which causes the latch to switch faster. The decision point of the sense latch typically occurs at 7 volts during TR3. The application of the $C_2 \cdot C_3$ signal during TR3 further causes the transfer of the data from the addressed cells of the memory array of the shift register 14.

Referring again to FIG. 4 the operation of the sense amplifier/latch 12 will now be described with reference to its operation in the memory test mode, during which the analog memory threshold window of each memory cell is determined. During the test mode the individual memory transistors of each selected memory cell are selectively overridden via control circuitry 16 and the left, L, and right, R, signals that are impressed upon the gates of transistors Q19 and Q20 of analog test means 26a and 26b to selectively turn these transistors "on" or "off" and cause VR1 to be coupled via Q19 and Q20 to nodes 1 and 2. The technique for measuring the characteristic threshold voltages of each of the memory transistors is the same as described in the earlier filed applications in that each cell is first tested for its previously written analog threshold voltage states and then written with opposite data so that the complement analog threshold voltage states can be determined. Four individual tests for each memory cell are therefore applied to determine the characteristic analog threshold voltages of each of the memory cells.

During the testing of each of the individual characteristic threshold voltages of each memory transistor, it is necessary to force the sense amplifier/latch 12 into the stable state opposite to that of correct data with VR1 and then incrementally vary the row address voltage, VR2, impressed on the gate of the selected memory transistor via control circuitry 16 to cause the sense latch to assume its opposite, or correct data state. The incremented voltage VR2 at which the latch switches will correspond to the analog threshold voltage of the memory transistor.

To preset the sense latch in an initial stable state, however, it is necessary that VR1 be sufficiently large to cause the latch to switch. It is therefore necessary prior to implementing the test mode to determine the required value for VR1, which is slightly less than the decision point of the sense latch; but which is not necessarily the same as during the read and write modes since there are additional conductance paths to nodes 1 and 2 through the transistors Q19 and Q20 that will affect the resultant decision point of the sense latch. To determine the required magnitude of VR1, it is necessary to perform a test on each of the columns of memory transistors, wherein a block of memory cells will be addressed and the normal row address voltage will be applied to the gates of the memory transistors while selectively applying L and R signals to the gates of transistors Q19 and Q20 and varying VR1 incrementally via control circuitry 16 over individual read cycles, until the latch assumes one of its stable states corresponding to correct data. In this manner the value of VR1 at which the latch assumes a stable state can be determined, and this value of VR1 will then be impressed upon the drains of Q19 and Q20 of analog test means 26a and 26b during the remaining testing of the memory array 10 for the characteristic analog threshold voltages.

During an individual test of a selected memory transistor for one of its characteristic threshold voltages, the selective application of either L or R to Q19 or Q20 via control circuitry 16 will couple VR1 to one of the latch 12 nodes and the source of one of the memory transistors within each of the selected memory cells. Assuming memory transistor Q4 is to be tested, the application of L to the gate of Q19 will cause Q19 to turn on thereby coupling VR1 to the source of memory transistor Q4. The row address voltage VR2 is applied to the gate of Q4 and initially is at a value above the expected analog threshold voltage, and the sense amplifier/latch 12 is cycled in a manner similar to the normal read mode. VR1 will override the conduction of the memory transistor Q4 and will cause the latch to assume one of its stable states. By incrementally decreasing the row address voltage VR2 over successive read operations via control circuitry 16, the sense amplifier/latch 12 will at some point assume its opposite stable state; the specific row address voltage VR2 at which the latch switches being functionally related to the characteristic analog threshold voltage of the selected memory transistor being tested, in this case Q4. By repeating this incremental testing process for each of the memory transistors of each of the memory cells a plot can be obtained of the analog voltage threshold memory window for the entire memory array. While the test sequence requires four different incremental tests for each of the memory cells with an intermediate write operation, it is to be remembered that the tests are occurring a block at a time.

Figure 9:
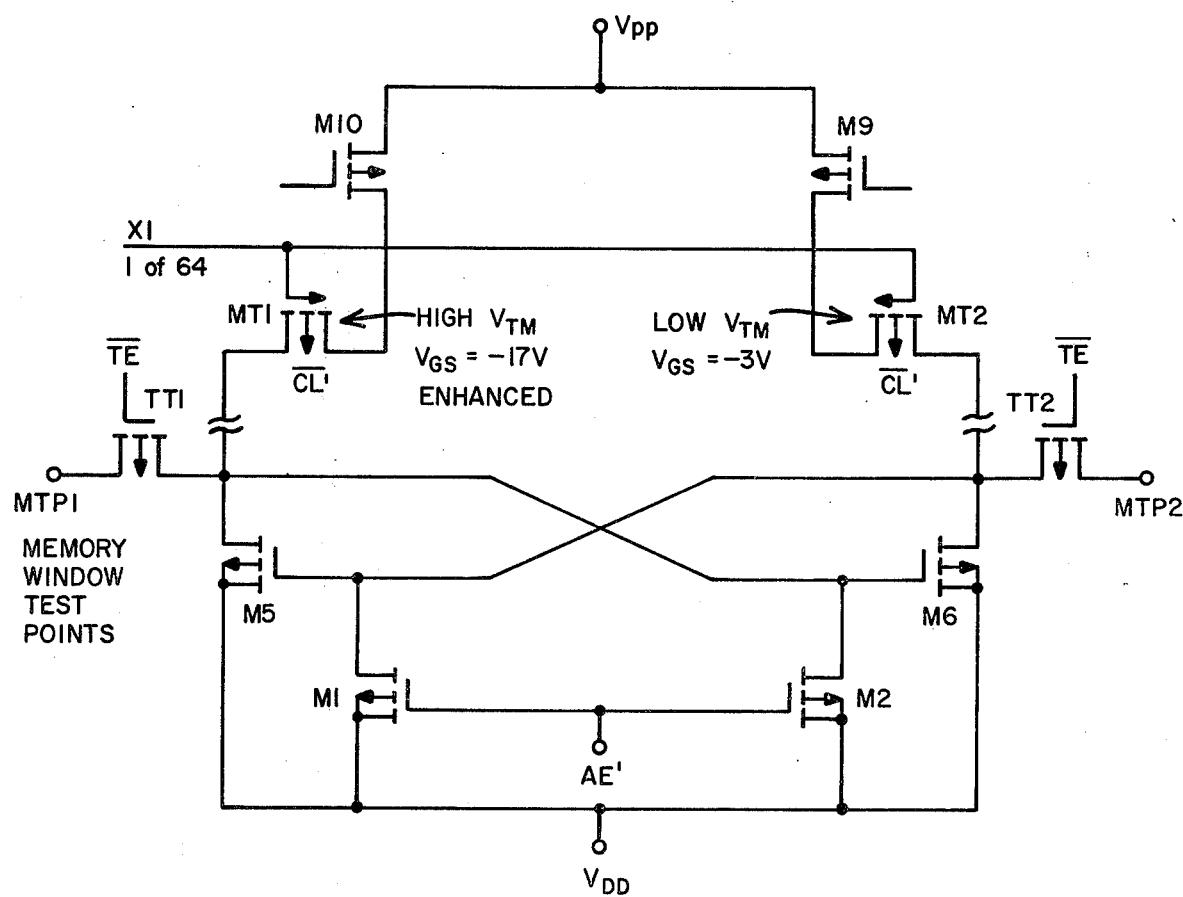
FIG. 9 is a schematic of the prior art sense latch described in the paper presented to the IEEE Annual Conference on Nuclear and Space Radiation Effects on July 12 to 15 of 1977.

With reference to FIG. 9, a sense latch is shown that was disclosed in a paper entitled Hardened MNOS/SOS Electrically Reprogrammable Non-Volatile Memory, authored by J. R. Cricchi, et al, and B. T. Ahlport and presented to the IEEE Annual Conference On Nuclear and Space Radiation of Facts on July 12 to 15, 1977. The sense latch disclosed is used in a 256-word × 4-bit MNOS/SOS RAM. The latch as disclosed is similar to the present invention in that the gates of the individual memory transistors of the associative memory cells are directly addressed during the read mode and their differential conduction produces differential voltages on the output nodes of the sense latch, which differential voltages are functionally related to the binary information stored within the memory cells. The circuit however, does not disclose the use of amplifying means 20 where the speed-up transistors Q8 and Q9 overcome the delays of the parasitic capacitance and resistance of the common source and drain line diffusions of the memory array columns. The circuit as shown might therefore provide slower read times than obtainable with the present invention.

The operation of the circuit of FIG. 9 further differs from the present invention during its test mode in that the characteristic analog threshold voltages of the memory transistors of the memory array are obtained by using the test points MTP1 and MTP2, while applying the $\overline{TE}$ signal to the gates of TT1 and TT2 to turn these transistors "on" during the test mode and sequentially addressing each of the memory cells of the memory array, to produce outputs at the test points which directly reflect the analog memory window.

While it is desirable to be able to use the test points while sequentially adressing the memory transistors to produce outputs directly indicative of the analog threshold voltages, without having to proceed through the slower incremental test approach as in the present invention, it is not feasible to apply this approach or the sense latch circuit described in the publication to the BORAM construction as described in the present invention. The RAM described in the publication requires only four sense amplifier/latches to sense the data and analog threshold voltages of the memory cells and an additional eight transistors and associated test points, which necessitates an additional eight pins per chip to enable the testing of the analog threshold voltages of the array. In the organization of the present invention, wherein 32 bits of data are read out at a time in a block fashion, an additional 64 test transistors would be required as well as an additional 64 test pins per package to enable the testing of the threshold voltages in the manner as taught by the publication. From a design perspective the additional chip space required for the test transistors and the 64 pin requirement are prohibitive, since optimal design requires a designer to maintain the total chip space and number of pins per circuit package at a minimum. The additional test time required by using the presently described sense amplifier/latch is therefore preferable over the alternative disadvantages of the increased chip space and pin requirements of the publication, especially in BORAM organizations similar to that described herein.

What is claimed is:

1. A sense latch circuit selectively operable in a read or write mode for reading and writing binary information out of or into a block oriented random access memory comprising:

a bistable latch, comprised of a plurality of cross coupled transistors and having two output nodes for providing first and second stable latch outputs corresponding to binary information;

a shift register coupled to one of the nodes;

a dummy load coupled to the other of the nodes;

a plurality of associative memory cells coupled to the nodes, each cell comprised of first and second field effect memory transistors, each memory transistor having a plurality of threshold voltages, a source terminal, a drain terminal and a gate terminal, coupled together at their respective drain terminals and to a separate one of the nodes at their respective source terminals;

means for decoding a binary address and selectively addressing an individual cell to cause a row address voltage to be applied to the gate terminal of each of the memory transistors of the selected cell, the conduction of each memory transistor being dependent on its respective threshold voltage and the row address voltage;

amplifying means coupled to the nodes for causing the latch to switch faster in response to the differential conduction between the memory transistors of the selected cell;

write means coupled to the latch nodes for shorting the source and drain terminals of the memory transistors of a selected memory cell during the write mode;

precharge means coupled to the latch nodes for precharging the latch nodes.

2. The sense amplifier/latch of claim 1 including analog test means for operating the sense amplifier/latch in a memory test mode, wherein the analog test means comprises:

a first voltage source of sufficient magnitude to cause the latch to assume one of its stable outputs;

first and second transistor means, each coupled to a separate one of the nodes, for selectively coupling the first voltage source to a separate one of the nodes;

means for controlling the first and second transistor means and incrementing or decrementing the row address voltage over successive memory test operations until the latch output switches from the output induced by the first voltage source, the voltage at which the latch switches corresponding to the analog threshold of the selected memory transistor.

3. The sense amplifier/latch as set forth in claim 2 wherein the amplifying means comprises:

first and second field effect transistors, each having a source terminal, a drain terminal and a gate terminal, series connected at their drain terminals, the source terminal of each of said first and second field effect transistors connected to a separate one of the nodes;

a second voltage source connected to the common connected drain terminals of the first and second field effect transistors;

means connected to the gate terminals of said first and second field effect transistor for causing the transistors to conduct and couple the second voltage source to the latch nodes.

4. The sense amplifier/latch circuit as set forth in claim 1 wherein each of the memory transistors comprises an MNOS field effect transistor.

5. The sense amplifier/latch as set forth in claim 3 fabricated as an integrated circuit.

6. A sense amplifier/latch circuit selectively operable in a read, write or memory test mode for reading and writing binary information out of or into a block oriented random access memory or for testing the respective analog threshold voltages of each memory transistor in the memory array comprising:

a bistable latch comprised of a plurality of cross coupled transistors and having two output nodes for providing first and second stable latch outputs corresponding to binary information;

a shift register coupled to one of the nodes;

a dummy load coupled to the other of the nodes;

a plurality of associative memory cells coupled to the nodes, each cell comprised of first and second field effect memory transistors, each memory transistor having a plurality of theshold voltages, a source terminal, a drain terminal and a gate terminal, coupled together at their respective drain terminals and to a separate one of the nodes at their respective source terminals;

means for decoding a binary address and selectively addressing an individual cell to cause a row address voltage to be applied to the gate terminal of each of the memory transistors of the selected cell, the conduction of each memory transistor being dependent on its respective threshold voltage and the row address voltage;

amplifying means coupled to the nodes for causing the latch to switch faster in response to the differential conduction between the memory transistors of the selected cell comprising:

first and second field effect transistors, each having a source terminal, a drain terminal and a gate terminal, series connected at their drain terminals, the source terminal of each of said first and second field effect transistors connected to a separate one of the nodes;

a second voltage source connected to the common connected drain terminals of the first and second field effect transistors;

means connected to the gate terminals of said first and second field effect transistors for causing the transistors to conduct and couple the second voltage source to the latch nodes;

write means coupled to the latch nodes for shorting the source and drain terminals of the memory transistors of a selected memory cell during the write mode;

precharge means coupled to the latch nodes for precharging the latch nodes;

analog test means for operating the latch in a memory test mode comprising:

a first voltage source of sufficient magnitude to cause the latch to assume one of its stable outputs;

first and second transistor means, each coupled to a separate one of the nodes, for selectively coupling the first voltage source to a separate one of the nodes;

means for controlling the first and second transistor means and incrementing or decrementing th row address voltage over successive memory test operations until the latch output switches from the output induced by the first voltage source, the voltage at which the latch switches corresponding to the analog threshold of the selected memory transistor.

7. The sense amplifier/latch as set forth in claim 6 wherein each of the memory transistors is an MNOS field effect transistor.

* * * * *